(12) United States Patent
Reid

(10) Patent No.: US 7,057,251 B2
(45) Date of Patent: Jun. 6, 2006

(54) MEMS DEVICE MADE OF TRANSITION METAL-DIELECTRIC OXIDE MATERIALS

(75) Inventor: Jason S. Reid, Los Gatos, CA (US)

(73) Assignee: Reflectivity, INC, Sunnyvale, CA (US)

( * ) Notice: Subject to any disclaimer, the term of this patent is extended or adjusted under 35 U.S.C. 154(b) by 135 days.

(21) Appl. No.: 10/198,389

(22) Filed: Jul. 17, 2002

(65) Prior Publication Data
US 2003/0036215 A1 Feb. 20, 2003

Related U.S. Application Data

(63) Continuation-in-part of application No. 09/910,537, filed on Jul. 20, 2001.

(51) Int. Cl.
*H01L 31/0232* (2006.01)

(52) U.S. Cl. .................. 257/432; 257/444; 438/52

(58) Field of Classification Search ............ 257/295, 257/296, 306, 310, 415; 438/52, 53, 455, 438/459, 619, 951
See application file for complete search history.

(56) References Cited

U.S. PATENT DOCUMENTS

| | | |
|---|---|---|
| 4,904,543 A | 2/1990 | Sakakima et al. |
| 5,262,000 A | 11/1993 | Welbourne et al. |
| 5,439,754 A | 8/1995 | Iwasaki et al. |
| 5,441,597 A | 8/1995 | Bonne et al. |
| 5,444,173 A | 8/1995 | Oyama et al. |
| 5,581,436 A | 12/1996 | Summerfelt et al. |
| 5,612,574 A | 3/1997 | Summerfelt et al. |
| 5,619,393 A | 4/1997 | Summerfelt et al. |
| 5,622,893 A | 4/1997 | Summerfelt et al. |
| 5,656,101 A | 8/1997 | Hayakawa et al. |
| 5,665,628 A | 9/1997 | Summerfelt |
| 5,679,980 A | 10/1997 | Summerfelt |
| 5,696,018 A | 12/1997 | Summerfelt et al. |
| 5,696,619 A | 12/1997 | Knipe et al. |
| 5,729,054 A | 3/1998 | Summerfelt et al. |

(Continued)

OTHER PUBLICATIONS

Maex, K. et al, ED, Properties of Metal Silicides, pp. 97-102, Published by Inspec, London, England, 1992.

(Continued)

*Primary Examiner*—Zandra V. Smith
*Assistant Examiner*—Khanh Duong
(74) *Attorney, Agent, or Firm*—Gregory R. Muir

(57) ABSTRACT

Micromechanical devices are provided that are capable of movement due to a flexible portion. The micromechanical device can have a flexible portion formed of an oxide of preferably an element from groups 3A to 6A of the periodic table (preferably from the first two rows of these groups) and a late transition metal (preferably from groups 8B or 1B of the periodic table). The micromechanical devices can be any device, particularly MEMS sensors or actuators preferably having a flexible portion such as an accelerometer, DC relay or RF switch, optical cross connect or optical switch, or a micromirror part of an array for direct view and projection displays. The flexible portion is preferably formed by sputtering a target having a group 8B or 1B element and a selected group 3A to 6A element, namely B, Al, In, Si, Ge, Sn, or Pb. The target can have other major constituents or impurities (e.g. additional group 3A to 6A element(s)). The target is reactively sputtered in a oxygen ambient so as to result in a sputtered hinge. It is possible to form both stiff and/or flexible portions of the micromechanical device in this way.

46 Claims, 12 Drawing Sheets

U.S. PATENT DOCUMENTS

| | | | |
|---|---|---|---|
| 5,729,074 | A | 3/1998 | Shiomi et al. |
| 5,793,057 | A | 8/1998 | Summerfelt |
| 5,942,054 | A | 8/1999 | Tregilgas et al. |
| 5,994,750 | A | 11/1999 | Yagi |
| 6,020,215 | A | 2/2000 | Yagi et al. |
| 6,024,801 | A | 2/2000 | Wallace et al. |
| 6,090,697 | A | 7/2000 | Xing et al. |
| 6,124,650 | A * | 9/2000 | Bishop et al. ........ 310/40 MM |
| 6,153,490 | A | 11/2000 | Xing et al. |
| 6,171,970 | B1 | 1/2001 | Xing et al. |
| 6,177,351 | B1 | 1/2001 | Beratan et al. |
| 6,190,802 | B1 | 2/2001 | Clerc et al. |
| 6,316,786 | B1 | 11/2001 | Mueller et al. |
| 6,395,168 | B1 | 5/2002 | Acernese et al. |
| 6,436,853 | B1 | 8/2002 | Lin et al. |
| 6,445,106 | B1 | 9/2002 | Ma et al. |
| 6,449,079 | B1 | 9/2002 | Herrmann |
| 6,479,920 | B1 | 11/2002 | Lal et al. |
| 6,522,801 | B1 | 2/2003 | Aksyuk et al. |
| 6,523,961 | B1 | 2/2003 | Ilkov et al. |
| 6,614,085 | B1 | 9/2003 | Hu |
| 2001/0008157 | A1 | 7/2001 | Bishop et al. |
| 2001/0040675 | A1 | 11/2001 | True et al. |

OTHER PUBLICATIONS

Rogl, P, et al., Phase Diagrams of Ternary Boron Nitride and Silicon Nitride Systems, pp. 1-2, 6-7, 18-19, 32-37, 76-78, 85-87, 97-100, 103-106, 113-120, 125-130, 133-134, 144-157, 169-171, 175-177, 180-186, 195-199, 205-209, 215-218 Published by ASM International, Materials Park, Ohio, 1992.

Brizoual et al., "Experimental Study of Ti-Si-N Films Obtained by Radio Frequency Magnetron Sputtering", Surface and Coatings Technology 116-119 (1999), pp. 922-926.

Cherry et al., Stability of Conducting Amorphous Ru-Si-O Thin Films Under Oxygen Annealing, Microelectronic Engineering 55 (2001), pp. 403-408.

DuBois, P., "Electrostatically Actuated Gas Microvalve Based on a Ta-Si-N Membrane", from the website of The Sensors, Actuators and Microsystems Laboratory at University of Neuchâtel, Switzerland (publication date unknown; accessed and printed Jul. 2, 2001).

Eisenbraun et al., "Low Temperature Inorganic Chemical Vapor Deposition ot Ti-Si-N Diffusion Barrier Liners for Gigascale Copper Interconnect Applications", J. Vac. Sci. Technol. B, vol. 18, No. 4 (Jul./Aug. 2000).

Gasser et al., "Reactively Sputtered Ru-Si-O Films", Journal of Applied Physics, vol. 86 No. 4 (Aug. 15, 1999).

Gretillat et al., "Surface-Micromachined Ta-Si-N Beams for Use in Micromachinics", J. Micromech. Microeng., vol. 8 (1998), pp. 88-90.

Hauert et al., "From Alloying to Nanocomposites—Improved Performance of Hard Coatings", Advanced Engineering Materials, vol. 2 No. 5 (2000), pp. 247-259.

He et al., "Letter to the Editor: Bonding Structure and Properties of Ion Enhanced Reactive Magnetron Sputtered Silicon Carbonitride Films", J. Phys.: Condens. Matter, vol. 12 (2000), pp. L591-597.

Herdt et al., "PVD Copper Barrier/Seed Processes: Some Considerations for the 0.15 um Generation and Beyond", Semiconductor Fabtech, 11th Edition (1999), pp. 259-264.

Kim et al., "Nanostructured Ta-Si-N Diffusion Barriers for Cu Metallization", J. Appl. Phys., vol. 82 No. 10 (Nov. 15, 1997), pp. 4847-4851.

Lee et al., "Characterization of Tantalum Nitride Films Deposited by Reactive Sputtering of Ta in N2/Ar Gas Mixtures", Materials Chemistry and Physics, vol. 68 (2001), pp. 266-271.

Linder et al., "Ternary Ta-Si-N Films for Sensors and Actuators", Sens. Actuators A, Phys. (Switzerland), vol. A61 No. 1-3 (1997), pp. 387-391.

Nicolet et al., "High Metastable Amorphous or Near-Amorphous Ternary Films (Micta mict Alloys)", Microelectronic Engineering, vol. 55 (2001), pp. 357-367.

Nicolet, M., "Reactively Sputtered Ternary Films of the Type TM-Si-N and their Properties (TM=Early Transition Metal)", Vacuum, vol. 59 (2000), pp. 716-720.

Oizumi et al., "Control of Crystalline Structure and Electrical Properties of TaSiN Thin Film Formed by Reactive RF-Sputtering", Jpn. J. Appl. Phys., vol. 39 (2000), pp. 1291-1294.

Pinnow et al., "Decomposition and Nanocrystallization in Reactively Sputtered Amorphous Ta-Si-N Thin Films", J. Appl. Phys., vol. 90 No. 4 (Aug. 15, 2001), pp. 1986-1991.

Sun et al., "Reactively Sputtered Ti-Si-N Films I: Physical Properties", J. Appl. Phys., vol. 81 No. 2 (Jan. 15, 1997), pp. 656-663.

Sun et al., "Reactively Sputtered Ti-Si-N Films II: Diffusion Barriers for Al and Cu Metallizations on Si", J. Appl. Phys., vol. 81 No. 2 (Jan. 15, 1997), pp. 664-671.

Wong et al., "Barriers for Copper Interconnections", from the website of the Interconnect Focus Center at Stanford University (May 4, 1999).

Linder, et al., "Ternary Ta-Si-N Films for Sensors and Actuators", Sensors and Actuators, Sens. Actuators A, Phys. (Switzerland), vol. A61 No. 1-3 (1997) pp. 387-391.

* cited by examiner

MEMS DEVICE MADE OF TRANSITION METAL-DIELECTRIC OXIDE MATERIALS

This application is a continuation-in-part of U.S. patent application Ser. No. 09/910,537 filed Jul. 20, 2001, the subject matter being incorporated herein by reference.

BACKGROUND

1. Field of Invention

The following publications are related to the present invention:
1) K. Onisawa, M. Fuyama, and K. Tamura, "Dielectric Properties of rf-Sputtered Y2O3 Thin Films," J. Appl. Phys. 68, 719 (1990);
2) 145. C. T. Hsu, Y. K. Su, and M. Yokoyama, "High Dielectric Constant of RF-Sputtered HfO2 Thin Films," Jpn. J. Appl. Phys. 31, 2501 (1992);
3) R. M. BUENO, J. M. MARTINEZ-DUART, M. HERNÁNDEZ-VÉLEZ, L. VÁZQUEZ "Optical and structural characterization of R.F. sputtered CeO2 thin films" J. Mat. Sci.,32, (1997), 1861–1865;
4) A. K. Chu, M. J. Chuang, K. Y. Hsieh, H. L. Huang, Y. C. Yu, C. W. Wang, and E. K. Lin "Microstructure and Corrosion Resistance of Room-Temperature RF Sputtered Ta2O5 Thin Films", J. Electr. Mat. (1999) 1457–1460;
5) W. A. Bearzotti, A. Bianco, G. Montesperelli, E. Traversa "Humidity Sensitivity of Sputtered TiO2 Thin Films", Sens. Actuators B, 1994, (18–19), 525–528;
6) Sputtered MgO Thin Films on Conducting Underlayers, Inomata (ANL-MSD and Fujitsu Ltd., Japan), J. S. Jiang, and S. D. Bader, Int. Magnetics Conf., (INTERMAG 99), Kyongju, Korea, May 18–21,1999;
7) da Silva, L. A., Alves, V. A., de Castro, S. C., and Boodts, J. F. C. "XPS study of the state of iridium, platinum, titanium and oxygen in thermally formed IrO2+TiO2+PtOx films". Colloids and Surfaces A-Physicochemical and Engineering Aspects 170[2–3], 119–126.2000;
8) M. J. Aziz, E. Nygren, J. F. Hays, and D. Turnbull, "Crystal Growth Kinetics of Boron Oxide Under Pressure", Journal of Appl. Phys. 57, 2233 (1985);
9) Vossough, K. K., Hunt, C. E., "Reactive Plasma Sputter Deposition of Silicon Oxide", Mat. Rel. in Microelectr. VI. Symp, 8–12 April 1996, San Francisco, Calif.;
10) Danson, N., Hall, G. W., Howson, R. P., "Improved Control Techniques for the Reactive Magnetron Sputtering of Silicon to Produce Silicon Oxide and the Implications for Selected Film Properties", Thin Solid Films, 289, no. 1–2, p.99–106;
11) Gasser, S. M., Kolawa, E., Nicolet, N. A., "Reactively Sputtered Ru-Si-O films", Journal of Appl Phys, 15 August 1999, vol. 86, no.4, 1974–81;
12) Matsui, Y U., Hiratani, M., Kimura, S., "Thermal stability of RuO2 electrode Prepared by DC reactive sputtering", Jap. Journal of Appl. Phys., part 1, January 2000, vol. 39, no. 1 p.256–63;
13) U.S. Pat. Nos. 5,622,893; 5,581,436; 5,619,393; 5,665,628; 5,679,980; 5,729,054; 5,612,574 and 5,696,018 each to Summerfelt (et al.).

These publications and patents are incorporated herein by reference.

SUMMARY OF THE INVENTION

Oxide-based materials for MEMS applications can have desirable stress, hardness, elasticity and other properties for use as structural material in a MEMS device. Unfortunately, many oxide materials, such as oxides of aluminum or silicon are insulating materials. This can be a problem with contacting surfaces in MEMS due to a lack of charge dissipation in insulators. Because of the lack of charge dissipation, use of insulators in MEMS can be problematic. Also, MEMS materials can also undergo oxidation when exposed to oxygen when used or fabricated, especially at high temperatures. Other problems with MEMS materials also exist. In the present invention, MEMS materials are utilized that are preferably conductive, resistant to oxidation and/or have suitable hardness and elasticity characteristics. In the present invention, MEMS devices (micro electromechanical systems, micro optoelectromechanical systems, micromechanical systems, etc.) are provided that are capable of movement due to a flexible portion formed of a (preferably conductive) oxide material, the material comprising a plurality of a transition metal and a selected element from group 3A or 4A or the periodic table, namely boron, aluminum, indium, silicon, germanium, or tin, and oxygen. Though preferred, the oxide material of the present invention need not be conductive nor resistant to oxidation. Also, though preferred, the flexible portion of the MEMS device need not be formed of the oxide material, but instead, a structural portion that does not bend or flex could comprise the oxide material. In one embodiment of the invention, both stiff structural portions as well as plasticizing portions comprise the oxide material.

The oxide film in the invention may also contain minor amounts of impurities constituting less than 6 at. %. Noble gasses, for instance, may be present as a byproduct of sputtering processes. In some instances, the material can comprise an oxide that forms an insulating matrix (e.g. silicon oxide) with small "bubbles," "islands," or "particles," e.g late transition-metal oxide interspersed throughout the matrix. Or, depending upon the relative amounts of the ceramic and transition metal and deposition conditions, the material can comprise a transition metal matrix with small "bubbles," "islands," or "particles" of a group 3A or 4A oxide. In other instances, pure ternary phases are formed. In one embodiment, the late transition metal is a noble metal or ferromagnetic metal. In a preferred embodiment, the MEMS material is amorphous and conductive.

"Oxide" as used herein can be a monoxide or higher order oxide (dioxide, trioxide, etc.), as well as substoichiometric oxides. The MEMS devices can be any device, such as accelerometers, DC relay and RF switches, optical cross connects and optical switches, microlenses, reflectors and beam splitters, filters, oscillators and antenna system components, variable capacitors and inductors, switched banks of filters, resonant comb-drives and resonant beams, and micromirror arrays for direct view and projection displays. The flexible portion (e.g. the hinge of the mirror in the MEMS example herein) is preferably formed by sputtering a target or targets in an oxygen-containing ambient (and/or sputtering an oxide target) so as to result in a sputtered transition metal oxide hinge. It is also possible to form other parts of the MEMS device (e.g structural parts that do not flex) out of the transition metal oxide.

DETAILED DESCRIPTION

Figure 1A:
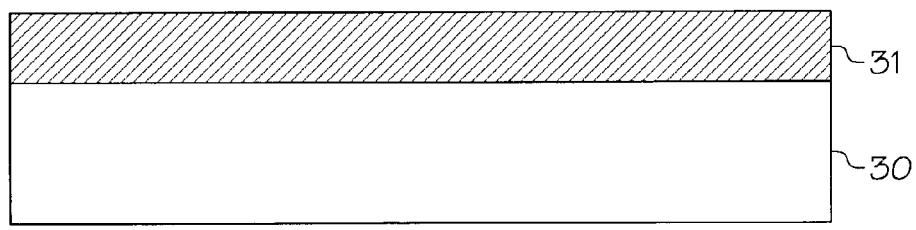
FIGS. 1A to 1J are cross sectional views of one method of making a MEMS device in accordance with the present invention.

Micromechanical Structure Fabrication:

Some of the materials of the present invention are known, such as for high temperature oxidation resistant barriers. However, as will be discussed below, such materials have not been used for MEMS devices, such as for hinges or other flexible portions of MEMS devices. A wide variety of MEMS devices can be made in accordance with the present invention, including sensors (e.g. pressure sensors and accelerometers); movable elements in microfluidics such as microvalves, micropumps and micronozzles; micromirrors for optical scanning, microscopy, spectroscopy, maskless lithography, projection displays and optical switching; MEMS switches such as DC relays and RF MEMS switches; variable capacitors, variable inductors and variable optical attenuators; phased array antennas and other military MEMS applications, microfabricated resonators, gyroscopes, microturbines, etc. The examples below are micromirrors, however any of these or other MEMS devices can be made in accordance with the methods and materials of the present invention. In a preferred embodiment, the oxide material does not react with gases surrounding the MEMS device (e.g. not a gas sensor or other chemical detector), but instead acts as a structural material having desirable mechanical properties and/or processing capablilities.

In a preferred embodiment of the present invention, a multiphase composite is provided. The multiphase composite is made up of a rigid matrix material, preferably a ceramic, that alone would be stiff, but somewhat brittle, and in which is a softer material such as a metal that alone could plastically deform, but could not sustain high loads. With the metal and ceramic together, however, the right combination of stiffness and plasticity can be achieved, increasing material toughness. Within the matrix material is the softer metallic material that is preferably in elemental rather than compound form (though, as will be seen below, multiphases can be present). The rigid matrix material is preferably a binary compound Y-Z where Y is a selected element from groups 3A to 4A of the periodic table (B, Al, In, Si, or Sn), and Z is O. In this way, the matrix material is preferably an oxide of silicon, aluminum or boron. In an example of the invention, the matrix is an aluminosilicate or borosilicate matrix. The oxide can include an additional component from groups 3A to 7A of the periodic table (e.g., P, C or N), though preferably the additional component is present in an amount of 10 atomic % or less. Within the matrix material is interspersed the softer metallic or metallic compound "particles" that preferably comprise a transition metal (preferably from groups 8B or 1B (columns headed by Fe, Co, Ni or Cu) of the periodic table) that is preferably not bound or less preferentially bound to oxygen. If the MEMS material is deposited by sputtering and the target is predominantly a transition metal, then the material can be a matrix of a transition metal (e.g. late transition metal) with particles of an oxide of e.g. Al, B or Si. Though the components of the deposited film may not change due to process parameter changes, the structural makeup of the deposited film (multiphase homogenous mixture, one element or compound embedded within a matrix of the other or vice versa) can change depending upon deposition conditions. The MEMS device could also be made up of a laminate of materials—particularly a microlaminate—though it is preferred that the material of the MEMS device be formed at the same time (e.g. by sputtering at the same time from a common target) and thus the various elements and compounds of the material are interspersed throughout the same layer.

In one embodiment of the invention, oxides of the transition metal are minimized—that is, a transition metal that does not readily form an oxide is selected such that the material is a two-component material formed of an oxide of, e.g. silicon, boron or aluminum, and a transition metal in predominantly elemental form (e.g. Pd, Pt, or Au). This can be accomplished by selecting a transition metal that does not readily form oxides, or that forms metastable oxides—and/or by annealing at a temperature that causes transition metal oxides to release the bound oxygen. Additionally, co-sputtering multiple targets could be used to create such a film. In the present application, the late transition metals are those transition metals in columns headed by Fe, Co, Ni, Cu or Zn (i.e. groups 8B, 1B and 2B), whereas the noble metals are defined in the present application as Ru, Rh, Pd, Ag, Os, Ir, Pt or Au, and the ferromagnetic transition metals are Fe, Co or Ni. Though the MEMS device of the present invention (or at least the flexible portions thereof) need not be conductive, in a preferred embodiment, the portions of the MEMS device that are made of the materials of the present invention are conductive. If it is desired for the material of the MEMS device to be conductive, the resistivity is preferably 10,000 $\mu\Omega cm$ or less, more preferably 3000 $\mu\Omega cm$ or less, and most preferably 1000 (or even 500) $\mu\Omega cm$ or less.

In one embodiment of the invention, an oxygen-containing atmosphere is used in a reactive sputtering apparatus, where the amount of oxygen in the atmosphere is from 5 to 90% (preferably where the deposited film has from 7 to 80% and more preferably from 10 to 60 at % O). Also, in one embodiment, the sputtering target has from 15 to 85% transition metal with the remainder being a selected element from groups 3A and 4A, as mentioned above. Also, the oxygen could be supplied to the film by use of an oxide target with or without oxygen in the atmosphere. If the atmosphere is used to supply oxygen, such could be an oxygen atmosphere supplied by a source of compressed oxygen connected to the sputtering apparatus.

Also, it is preferred that the deposited film is viewed as being amorphous, though the film can be viewed as polycrystalline as well, depending upon the type and amount of the different elements in the target, the amount of oxygen in the atmosphere during sputtering (if a sputtering process is used for deposition), the temperature and power of the deposition or whether or not the film is heated/annealed after formation, etc. Regardless of terminology, it is preferred that the film has a long range order of less than 250A, more preferably less than 100A. The long range order can be on the scale of 25 angstroms or less. Such a lack of long term order results in a more amorphous film—which in turn can result in less diffusion through the film.

Figure 1B:
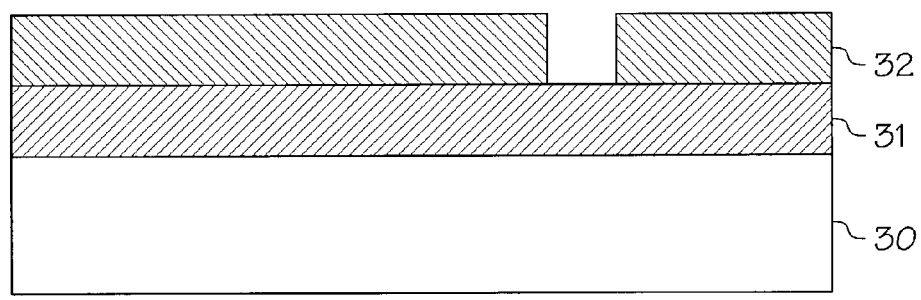
Figure 1C:
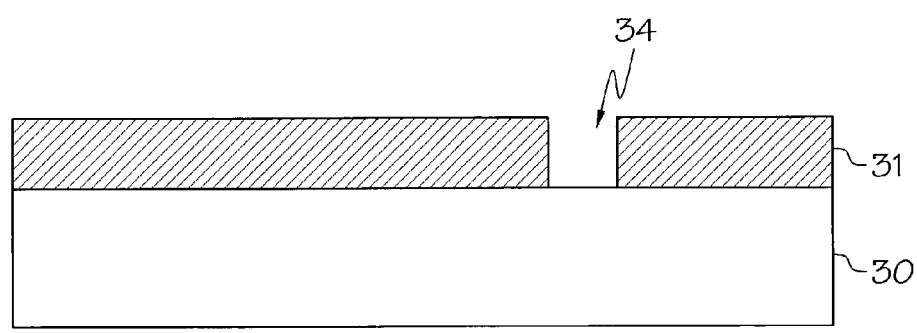
Figure 1D:
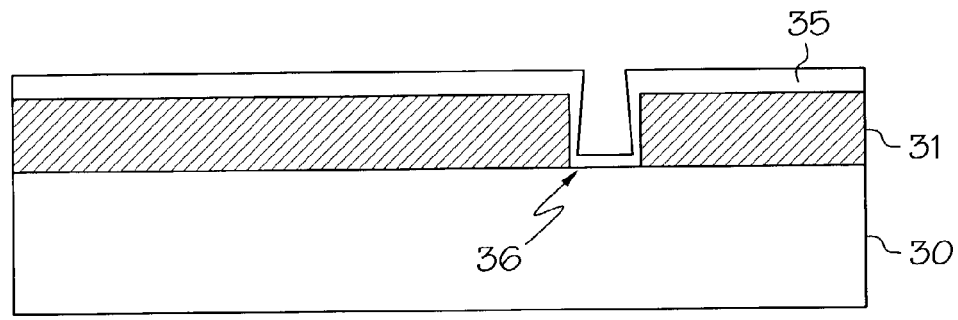

One example of a method for making the MEMS device of the present invention is illustrated in FIGS. 1A to 1J. As can be seen in FIG. 1A, a substrate 30 (this can be any suitable substrate, such as a light transmissive substrate (e.g. glass/quartz substrate) or a semiconductor circuit substrate (e.g. a silicon substrate with MOS circuitry thereon) that has deposited thereon a sacrificial material 31. Any suitable sacrificial material can be used, preferably one that has a large etching selectivity ratio between the material being etched and the sacrificial material. One possible sacrificial material is an organic sacrificial material, such as photoresist, or other organic materials such as set forth in U.S. patent application No. 60/298,529 filed Jun. 15, 2001 to Reid et al. Depending upon the exact makeup of the structural layer(s), other known MEMS sacrificial materials, such as amorphous silicon or PSG could be used. If the sacrificial material is not directly patternable, then a photoresist layer 32 is added and developed to form one or more apertures (FIG. 1B). Then, as can be seen in FIG. 1C, apertures 34 are etched into the sacrificial material 31 and the photoresist 32 is removed. As can be seen in FIG. 1D, a (preferably conductive) layer 35 is deposited that will ultimately form at least the flexible portions for the MEMS device (in this example a micromirror structure). Layer 35 can also form the posts 36 for attaching the micromirror to the substrate, or even all or part of the micromirror body. As will be discussed further herein, the conductive layer 35 in a preferred embodiment of the invention comprises the novel MEMS material of the present invention. Layer 35 could also be a plurality of (preferably conductive) layers, or one conductive layer among many other types of layers (structural dielectric layers, reflective layers, anti-stiction layers, etc.). Layer 35 need not be conductive, and depending upon the exact method, target material and atmosphere used in the deposition process, layer 35 could also be insulating.

Figure 1E:
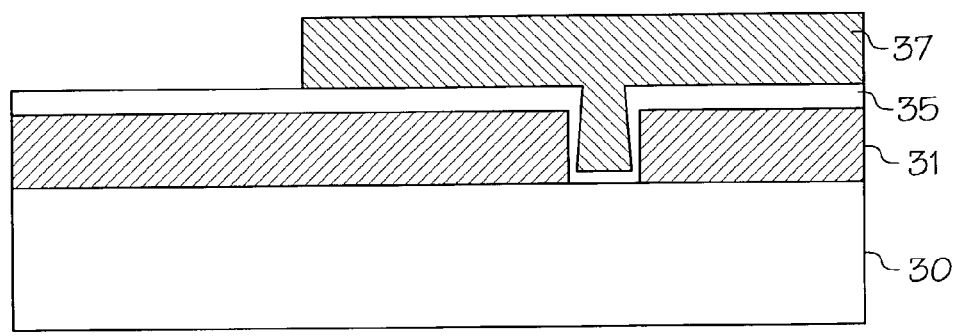
Figure 1F:
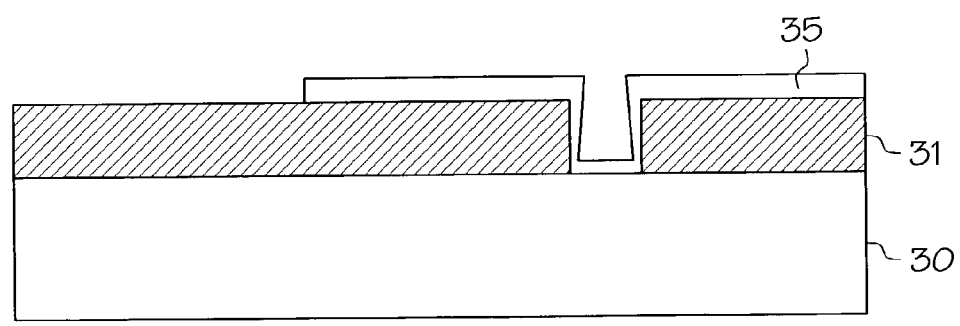
Figure 1G:
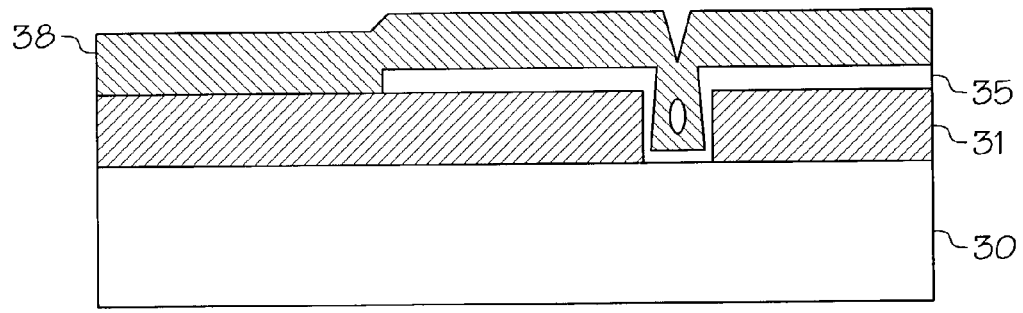
Figure 1H:
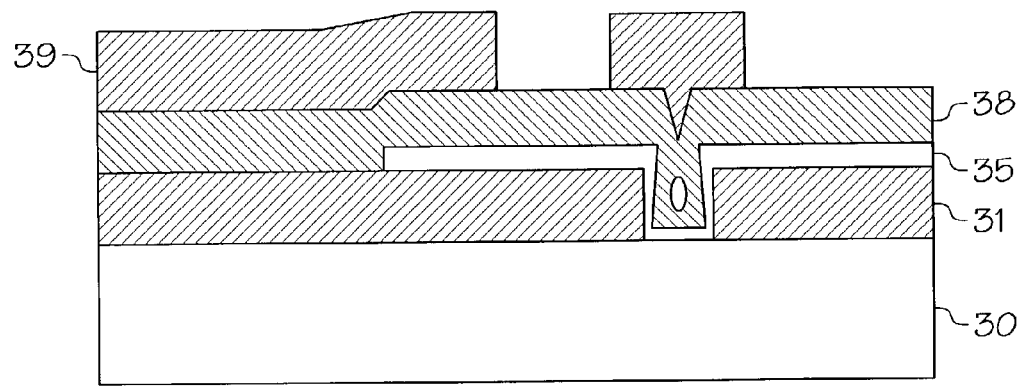
Figure 1I:
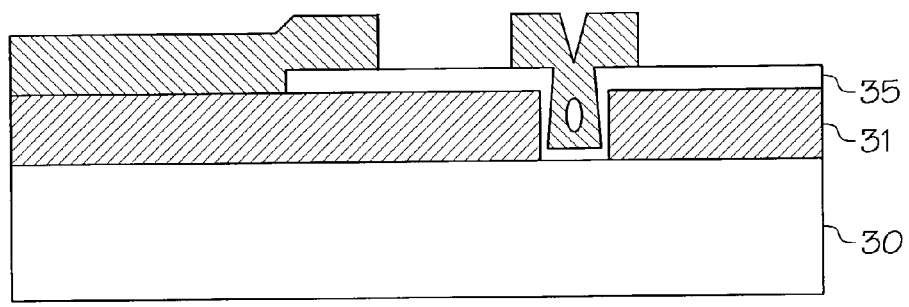
Figure 1J:
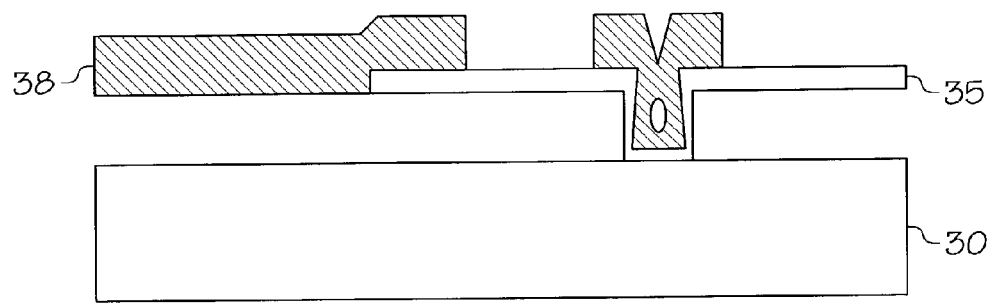

FIG. 1E shows the addition of photoresist 37 (patterned) followed by etching of a portion of the oxide layer(s) 35 and removal of the photoresist (FIG. 1F). Then, as can be seen in FIG. 1G, mirror structural material layer 38 is deposited. The material can be conductive or insulating and can be a plurality of layers. If the material is a single layer, it is preferably reflective (e.g., an aluminum or gold layer or metal alloy layer). Then, as can be seen in FIG. 1H, photoresist 39 is added and developed followed by (FIG. 1I) etching/removing portions of the layer 38 (such as in the area of the parts that will flex in operation). Finally, as can be seen in FIG. 1J, the sacrificial layer is removed to release the MEMS device so as to be free standing on the substrate. Not shown in FIG. 1 is circuitry that is formed on or in substrate 30 (if the substrate is a circuit substrate) or a light blocking layer on substrate 30 for improving automated handling of the substrate (if the substrate is a light transmissive substrate such as glass, quartz, sapphire, etc.).

As can be seen from FIGS. 1A to 1H, a free standing MEMS structure is created where layer 35 forms a flexible portion of the MEMS device, whereas layer 38 forms the structure that moves due to the flexible nature of layer 35. Layer 38, as can be seen, forms both the movable portion as well as the post or wall that holds the MEMS structure on the substrate 30. The movable element can be formed as a laminate of layers 38 and 35 (as well as additional layers if desired), or solely from layer 38, or even solely from layer 35. The make-up of the movable and flexible elements depend upon the ultimate stiffness or flexibility desired, the ultimate conductivity desired, the MEMS device being formed, etc.

As set forth in U.S. Pat. Nos. 5,835,256 and 6,046,840 to Huibers (incorporated herein by reference), if the substrate is light transmissive and the MEMS devices are mirrors, the light transmissive substrate can be bonded to a circuit substrate having electrodes thereon in order for the MEMS devices (micromirrors) to be addressable. Such a dual substrate approach could be for other MEMS devices such as micro-relays as set forth in EP1093143 to Bishop et al. published Apr. 18, 2001. However, the MEMS device could also be performed monolithically with the circuitry and micromechanical structures formed on the same substrate, such as set forth in U.S. Pat. No. 6,057,520 (high voltage MEMS switch on circuit substrate), U.S. Pat. No. 6,099,132 to Kaeriyama (micromirrors held on a circuit substrate), and U.S. Pat. No. 6,069,540 to Berenz et al. (RF switch formed monolithically with MMICs).

Figure 2A:
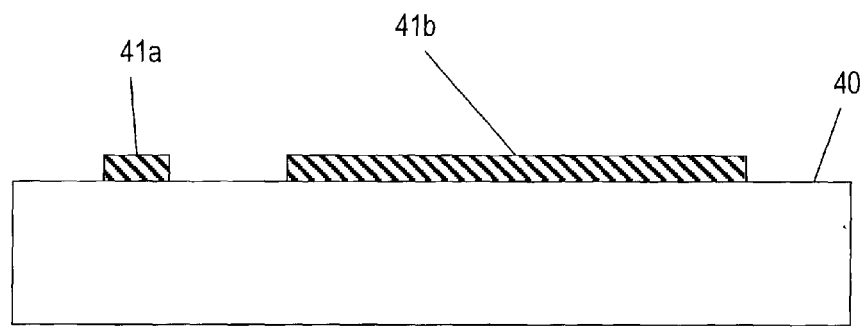
FIGS. 2A to 2G are cross sectional views of another method of making a MEMS device in accordance with the present invention.
Figure 2B:
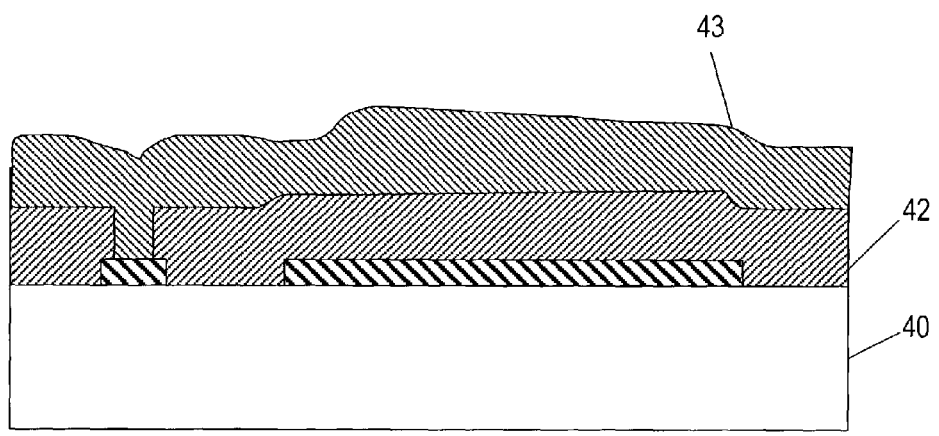
Figure 2C:
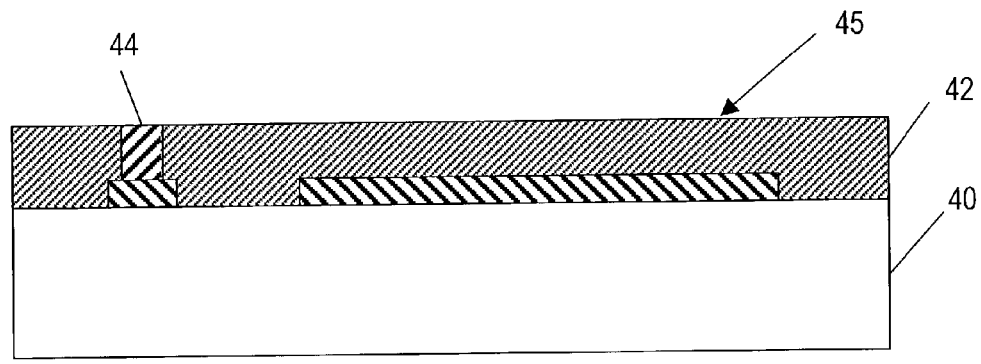

A MEMS device and process showing a circuit substrate and a pull-in electrode is illustrated in FIGS. 2A to 2G. As can be seen in FIG. 2A, a circuit (e.g CMOS) substrate 40 is provided having a patterned final metal layer 41a, 41b from the circuit process. Deposited thereon as can be seen in FIG. 2B, is a sacrificial layer 42, which can be any suitable sacrificial material as mentioned above. In the present example, the sacrificial material is amorphous silicon deposited by pressure enhanced chemical vapor deposition (PECVD) or sputtering (physical vapor deposition of PVD). The amorphous silicon can be annealed to increase stability and patterned to form apertures for MEMS structural material. Then, as can be further seen in FIG. 2B, a plug layer 43 (for example, a refractory metal such as W, Mo, Ti or Ta or a conductive metal compound) is deposited such as in a cold wall, low pressure CVD system, and preferably from a WF6 source (if the metal is W). For some plug materials, it may be desirable to first deposit a liner in order to avoid peeling (e.g., for a tungsten plug, a TiN, TiW or TiWN liner could be deposited to surround the tungsten in the hole in the sacrificial material and later after release of the sacrificial layer). This metal deposition is followed by chemical mechanical polishing (CMP) to form a plug 44 and a sacrificial layer 42 having a smooth surface 45 (FIG. 2C).

Figure 2D:
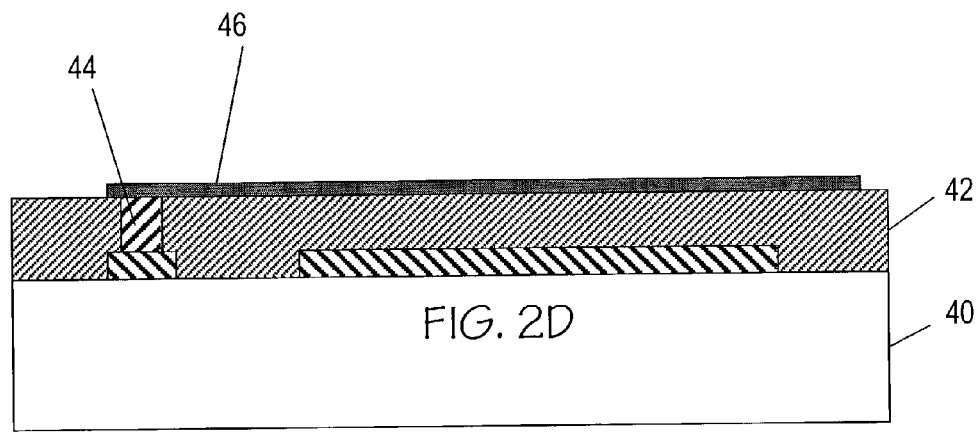
Figure 2E:
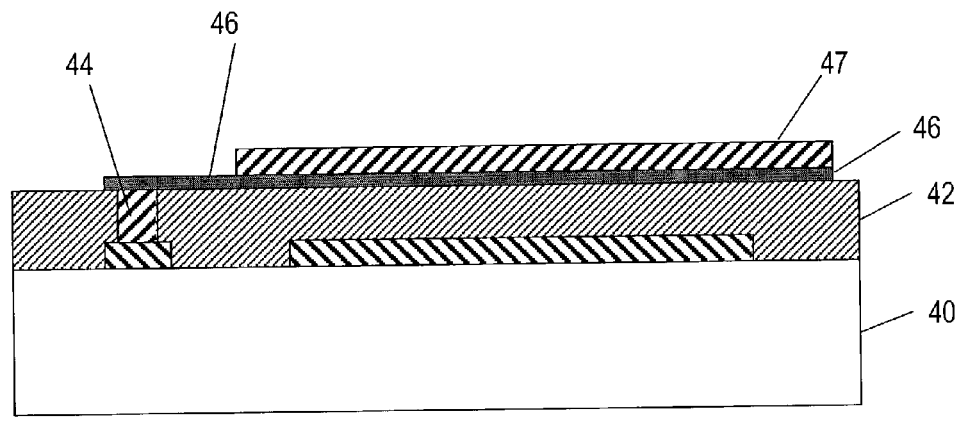
Figure 2F:
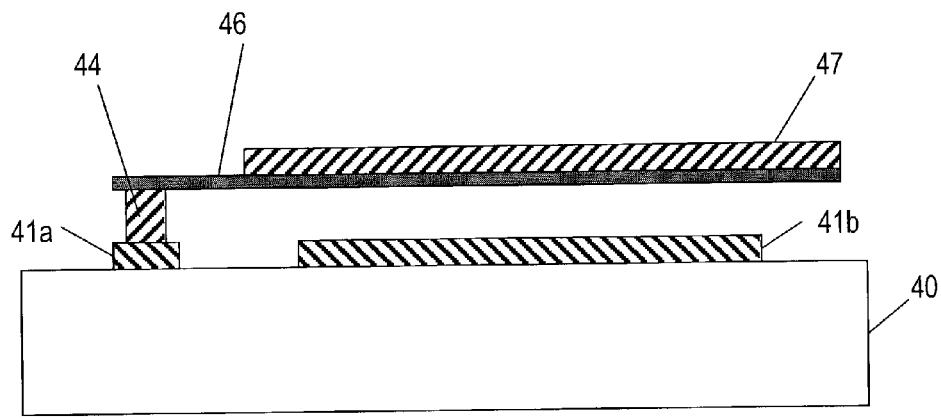
Figure 2G:
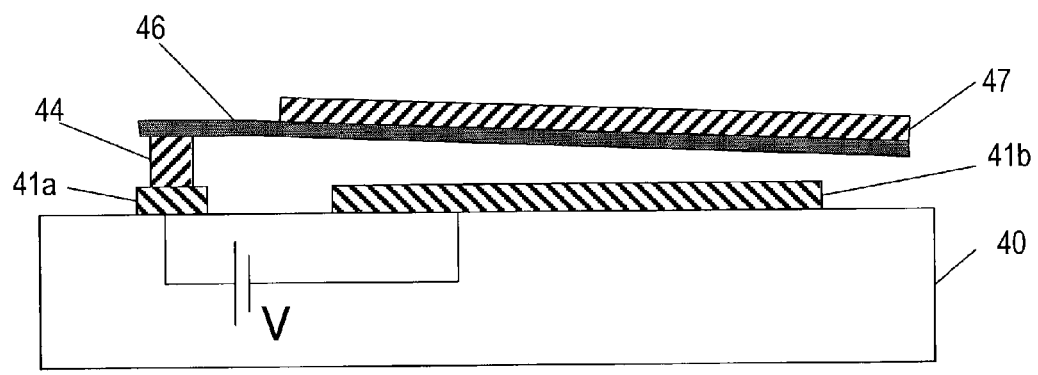

As can be seen in FIG. 2D, once the sacrificial layer 42 and plug 44 are planarized, layer 46 is deposited—preferably by sputtering. Layer 46 preferably comprises a metal-silicon (or Al or B) oxide, as will be discussed further below and is patterned to form the desired MEMS structural shape. In this example, layer 46 comprises the novel MEMS material of the present invention. After depositing layer 46, the layer can be annealed to change the stress characteristics of the layer, followed by patterning. Next, depending upon the type of MEMS device being formed, as can be seen in FIG. 2E, an additional structural layer 47 is added. This additional layer provides stiffness to the device, yet does not fully cover layer 46 after being patterned. The additional layer 47 can be reflective if the MEMS device being made is a micromirror. This structural arrangement allows the uncovered portion of layer 46 to flex from one position (FIG. 2F) to a deflected position (FIG. 2G) after removal of the sacrificial layer (e.g. with xenon difluoride if the sacrificial layer is amorphous silicon). In this way, at least a portion of the MEMS device is made of the oxide material of the present invention—where in the example of FIG. 1, both a structural and a flexible portion are made of the oxide material. The oxide material of the present invention can also be provided as multiple layers in addition to a reflective layer (if the MEMS device is a micromirror array), such as set forth in U.S. patent application No. 60/300,533. Also, alternating layers (e.g. nanolayers) of one material (e.g. a transition metal or transition metal oxide) and a second material (an oxide of a metalloid or a material in groups 3A or 4A of the periodic table) could be deposited rather than as a combined matrix as set forth elsewhere herein. Multilevel structures can be provided by repeating the steps shown in FIGS. 2B through 2D. In essence, all process steps and structures can be altered, omitted or added to, as long as at least part of the MEMS device formed is of the material of the invention as set forth herein.

In one embodiment of the invention, the MEMS material is a ternary (or higher) material X-Y-Z, where X is a late transition metal; Y is a selected element from groups 3A or 4A of the periodic table (e.g. Si, Al or B); and Z is O (or N—O). In the present application, a late transition metal or late transition metal oxide is a metal from columns 8B, 1B or 2B of the periodic table—columns headed by Fe, Co, Ni, Cu and Zn) interspersed throughout the matrix. In one embodiment, the late transition metal is a noble metal (for the present application this means Ru, Rh, Pd, Ag, Os, Ir, Pt or Au). In another embodiment, the late transition metal is Co, Ni or Fe). In a preferred embodiment, the MEMS material is amorphous and conductive.

Owing to their lack of grain boundaries, amorphous materials are preferred in the invention due to their minimized susceptibility to diffusion and, in some instances, increased hardness. Among the many choices for conductive binary oxide components possible in a transitional metal (Group 3A or 3B element)-oxygen multiphase film, the conductive dioxides of ruthenium, osmium, and iridium are preferred because they will not further oxidize in oxygen ambients, affording a high degree of stability in high-temperature environments. The combination of a metallic conductive oxide with a covalently bonded-ceramic such as $SiO_2$ can yield a conductive amorphous oxide containing the metal dioxide and ceramic oxide. Such a film is not only expected to be resistant to oxidation, but also yield an amorphous phase with a high crystallization temperature which will mitigate diffusion through the film with respect to polycrystalline analogs.

Similarly, a ternary alloy based on an oxide from the selected elements from groups 3A and 4A of the periodic table and Pt, Pd, or Au is another preferred embodiment of the invention. For instance, with a sufficiently oxygen-rich ambient, sputtering the Pt—Si, Pd—Si, or Au—Si targets may result in a mulitphase material having an elemental noble metal and $SiO_2$, barring the existence of possible ternary phases. By themselves, Pt, Pd, and Au are generally not prone to oxidation, but their inherently polycrystalline structure leaves them susceptible to oxygen diffusion via grain boundaries. By adding $SiO_2$ to form a composite material, the composite remains conductive, but the structure will be driven toward an amorphous state, minimizing oxygen diffusion. Moreover, adding the $SiO_2$ to the metal increases hardness of the material, which may benefit mechanical robustness of the MEMS device.

The flexibility of forming a number of different MEMS structure materials is in part due to sputtering a target in an oxygen-containing atmosphere. Co-sputtering multiple targets can be used, with the ambient tailored to each target. Though other deposition methods could be used, sputtering allows for a wide flexibility in target composition and ultimate material formed—as an almost unlimited number of targets could be used simply by purchasing a target from a supplier (e.g. Cerac or Testbourne, Ltd) or by forming novel targets by sintering or hot pressing various materials together in accordance with the invention. Though sputtering is not required to deposit a transition metal oxide on a substrate (various chemical vapor deposition—CVD—processes for example are known), in the present invention, sputtering (otherwise referred to as physical vapor deposition or PVD) is preferred. The target preferably comprises a transition metal and one of the selected elements from groups 3A or 4A of the periodic table. The target can be sputtered in an atmosphere of oxygen and a noble gas, for example (preferably at least oxygen—for chemically bonding to one or more components of the target upon release—and the noble gas for providing the physical aspect of the sputtering). The target could comprise oxygen in place of oxygen in the atmosphere (or in addition), as well as nitrogen and/or carbon (or other elements from groups 3A to 7A in the periodic table)—the amount of nitrogen or carbon (or other element) in the thus formed MEMS structural material will depend upon the amount of nitrogen or carbon in the target and/or sputtering atmosphere. In a preferred embodiment, the target comprises silicon and a late transition metal and the atmosphere comprises oxygen and argon. The target can be a compound of a transition metal, and aluminum, silicon or boron, (and could include oxygen, such as in the form of silicon dioxide) or the target could be separate unbound particles of each element, or even a multi-target co-sputtering arrangement could be used.

The preferred sputtering method is reactive sputtering. The target is sputtered in a glow discharge containing a gas mixture of Ar and $O_2$ (this could also be in an atmosphere of $O_2$ and another inert gas from group 8A of the periodic table (e.g. Ne). The oxide compounds can be formed in the plasma of the reactive sputtering apparatus, on the target face, and/or when sputtered atoms adsorb on the wafer surface and then react with the O gas atoms that hit the wafer surface. Reactive sputtering apparatus for performing this method are known in the art. Taking an Ir target as an example, a plasma sputtering or ion beam deposition in an oxygen-containing ambient would be useful for forming $IrO_2$ films for forming the MEMS device. For plasma sputtering, Ir atoms sputtered from the target can react with oxygen in the plasma to form iridium oxide. Or, an oxide can be allowed to form on the target in the poisoned deposition mode. For ion beam deposition, a broadbeam argon ion source sputters the Ir atoms from the target, and a broadbeam oxygen ion source is aimed at the wafer to form the oxide. Or, an oxide target can be used for ion beam deposition and an optional argon ion source is aimed at the wafer to control microstructure. In addition, atomic layer deposition could be utilized. This method relies on chemisorption of precursor gases that are introduced one at a time. One reactant is exposed to the wafer and a monolayer is formed. The first reactant is flushed out, and a second reactant is added, which deposits another monolayer.

Though other deposition methods could be used, sputtering is preferred because of the flexibility it allows in the choice of materials. Simply altering the composition of the sputtering target (e.g. one or more elements from groups 8B or 1B, and a selected element from groups 3A and 4A), sputtered in an atmosphere of oxygen and/or nitrogen, allows for a very large number of materials to be deposited. Though some materials will have better stress, elasticity and conductivity than other materials deposited in this way, a very large number of materials combinations for MEMS devices can be formed by sputtering in accordance with the present invention. For example, if a multi-target sputter deposition system is used, one or more oxide targets from Testbourne, Ltd could be used, such as targets of $Al_2O_3$, $In_2O_3$, $Fe_2O_3$, $Fe_3O_4$, $SiO_2$, $IrO_2$, $SnO_2$, and/or $CoOBO$ desired to use a target(s) substantially without oxygen and reactively sputter the target(s) in oxygen, a target from Testbourne of Al, Ag, B, Co, Cu, Au, In, Ir, Fe, Ni, Os, Pd, Pt, Re, Rh, Ru, Si, and/or Sn could be used. Other targets, such as those from Cerac, Inc. could also be used. Targets that have a combination of elements (other than oxygen) could be used and reactively sputtered in an oxygen atmosphere under optimized deposition conditions. For example, targets such as FeB (to form $Fe_2O_3$ and $B_2O_3$ in the MEMS material), $Os_2B$ (to form $OsO_2$ and $B_2O_3$), $Ni_2B$ (to form $Ni_2O_3$ and $B_2O_3$), and $Co_2B$ (to form CoO and $B_2O_3$), could be used. Or, a silicide target could be used, such as $FeSi_2$ (to form $Fe_2O_3$ and $SiO_2$), $OsSi_2$ (to form $OsO_2$ and $SiO_2$), $CoSi_2$ (to form CoO and $SiO_2$), etc. Of course the above is a simplification as other compounds of the same elements could be used (e.g. a Fe2Si target instead of FeSi2, etc.), and, depending upon deposition parameters, other or additional oxides (or elements) could be present. Because the oxygen often preferentially bonds with elements in groups 3A and 4A as well as with early transition metals vs. bonding with the late transition metals, unless there is an excess of oxygen, a ceramic matrix can form with interspersed softer metal particles (as an example, an Al2O3 or SiO2 matrix with a late transition metal such as Pd, Ag, Pt or Au or such metals less strongly bonded to oxygen). When substantially or fully saturated with oxygen, the deposited material can be a multi-phase material. Such a multi-phase MEMS material can aid in preventing elongation of microcracks, as the softer metal material "absorbs" microcracks that might develop in the more brittle surrounding matrix. Of course, depending upon the amounts of the materials in the target and deposition parameters, the softer material and the more brittle material can effectively trade places, where the softer material forms a matrix surrounding particles of the more brittle material.

Annealing the oxide MEMS structure may be desirable in some situations. For example, if it is desired to have a tensile stress film (or a zero stress film) the deposited film can be annealed (e.g. at 400 to 500 C.) to cause a compressive film to have lower stress, zero stress or even tensile stress. Annealing can also help to eliminate late transition-metal to O bonding. Though the late transition metal can be as an oxide compound after deposition, in a preferred embodiment the late transition metal is primarily in elemental (unbound to oxygen) form. In one embodiment of the invention, the MEMS film is deposited to have compressive stress and relatively low resistivity, and is annealed to turn the stress tensile (preferably from 0 to 100 MPa).

Figure 3A:
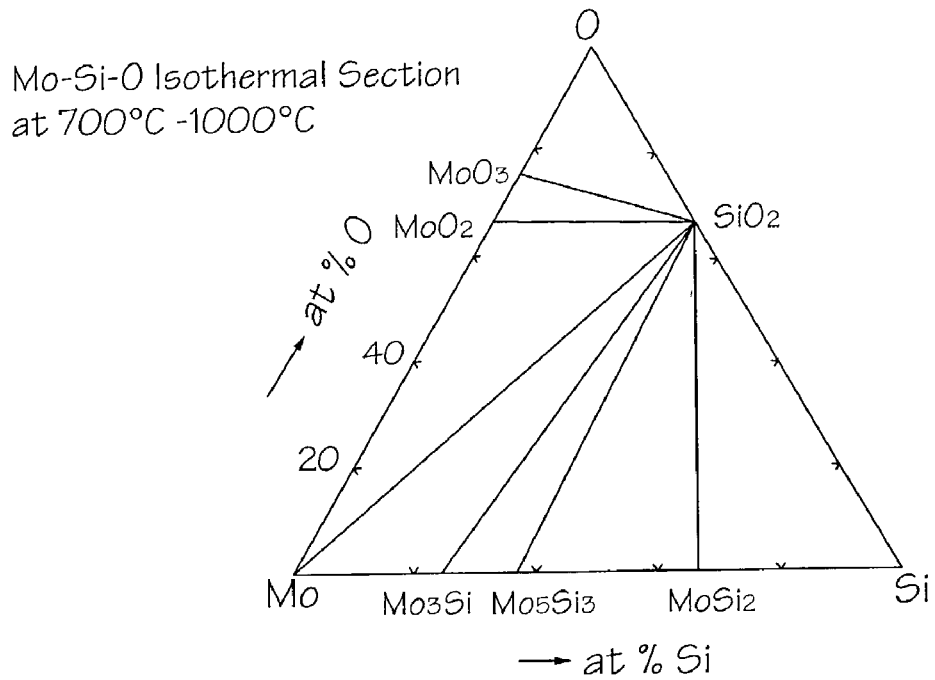
FIGS. 3A to 3G are ternary phase diagrams of examples of materials of the present invention.
Figure 3B:
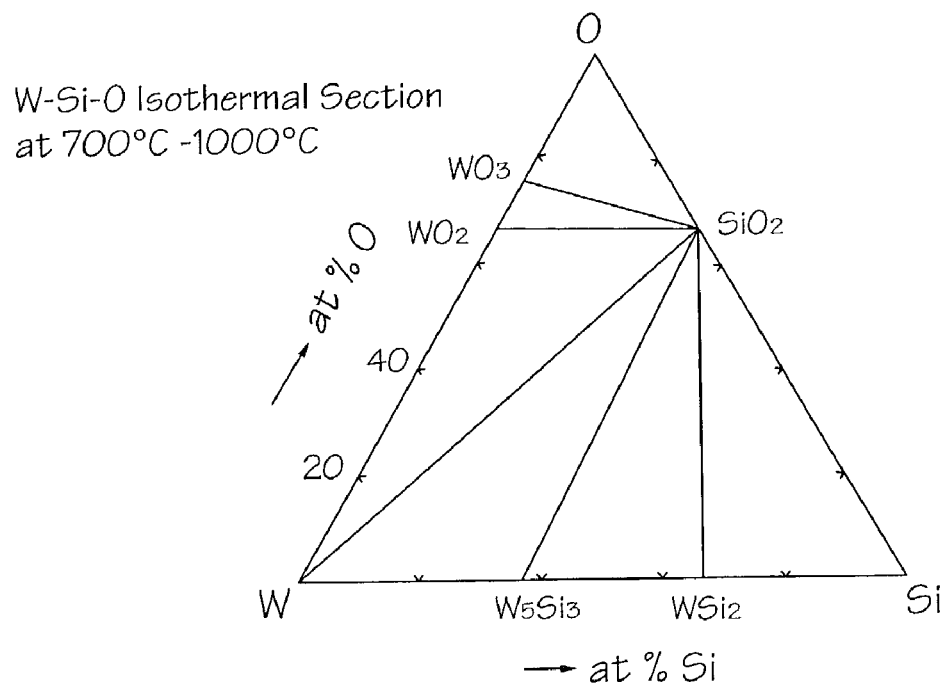
Figure 3C:
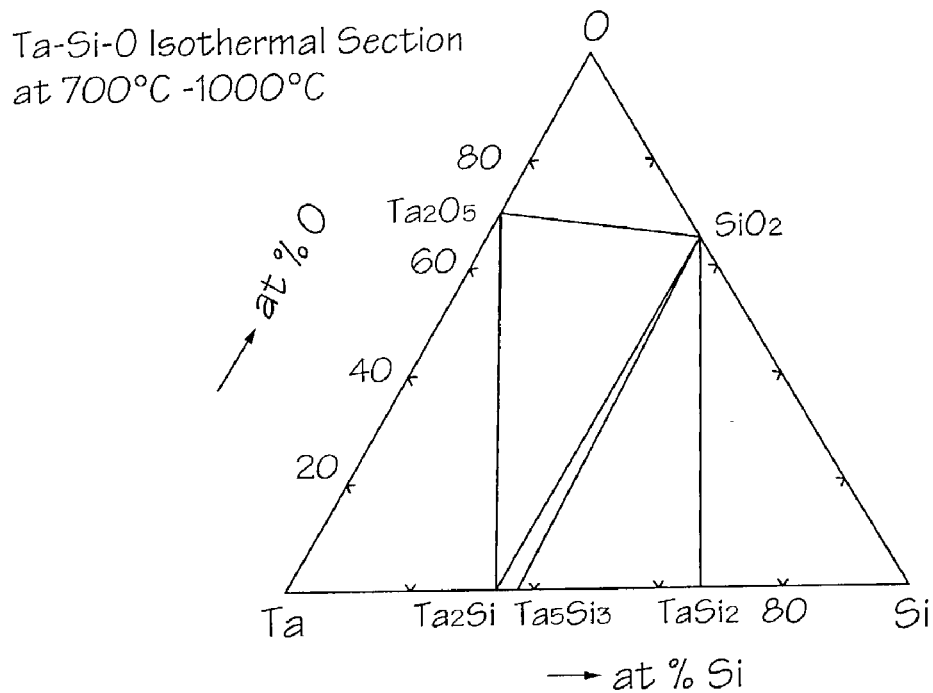
Figure 3D:
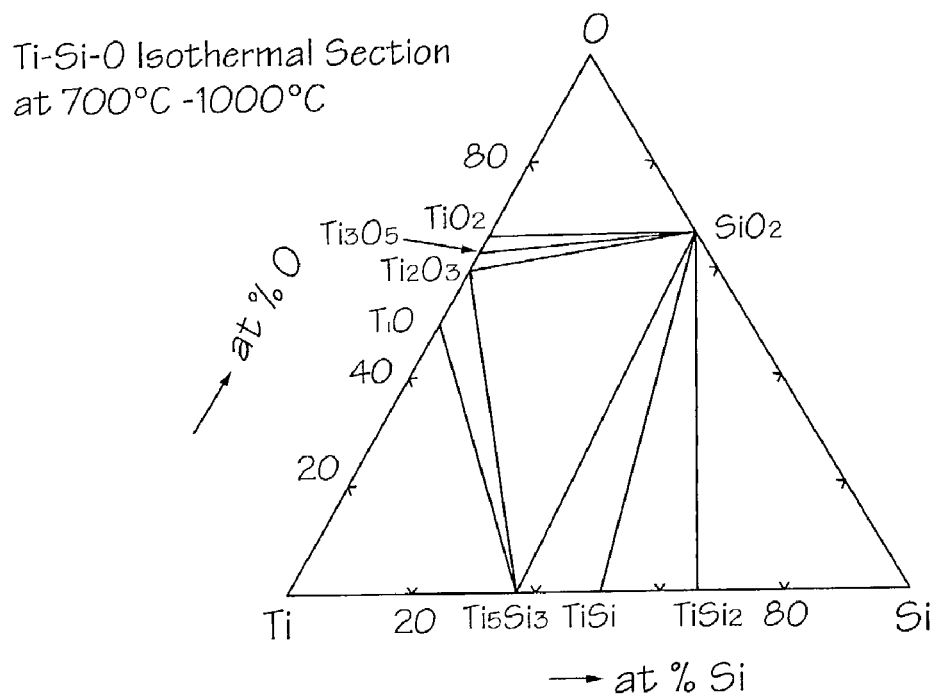
Figure 3E:
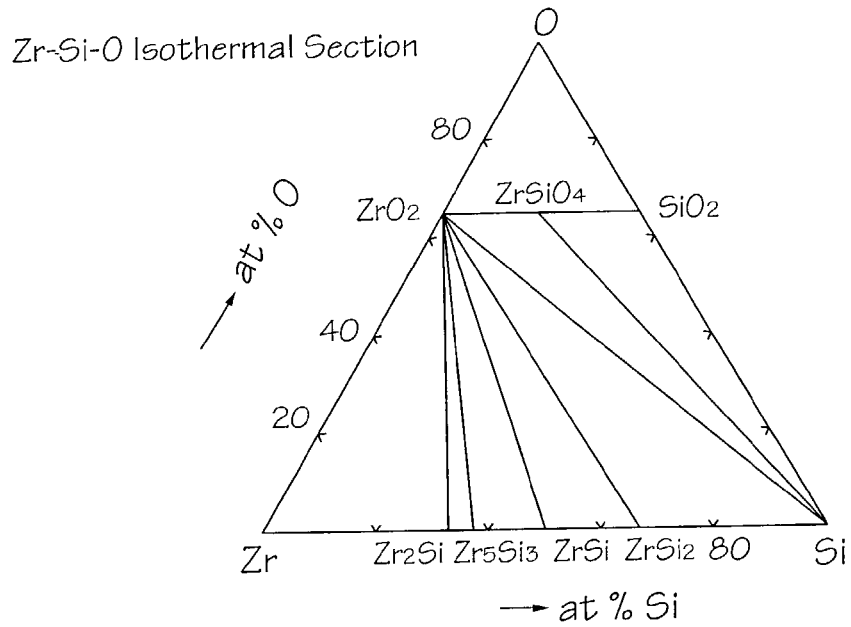
Figure 3F:
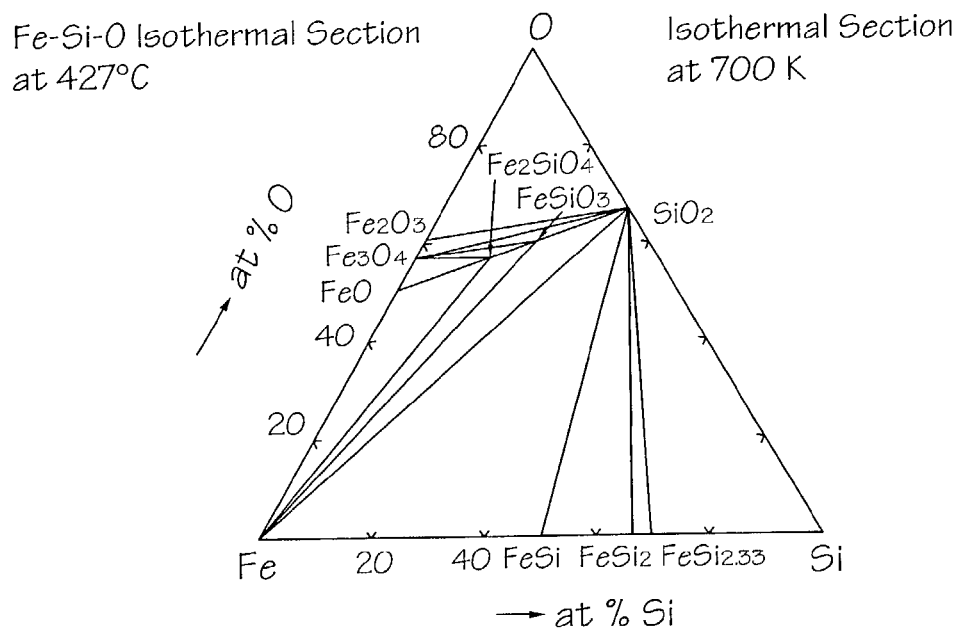
Figure 3G:
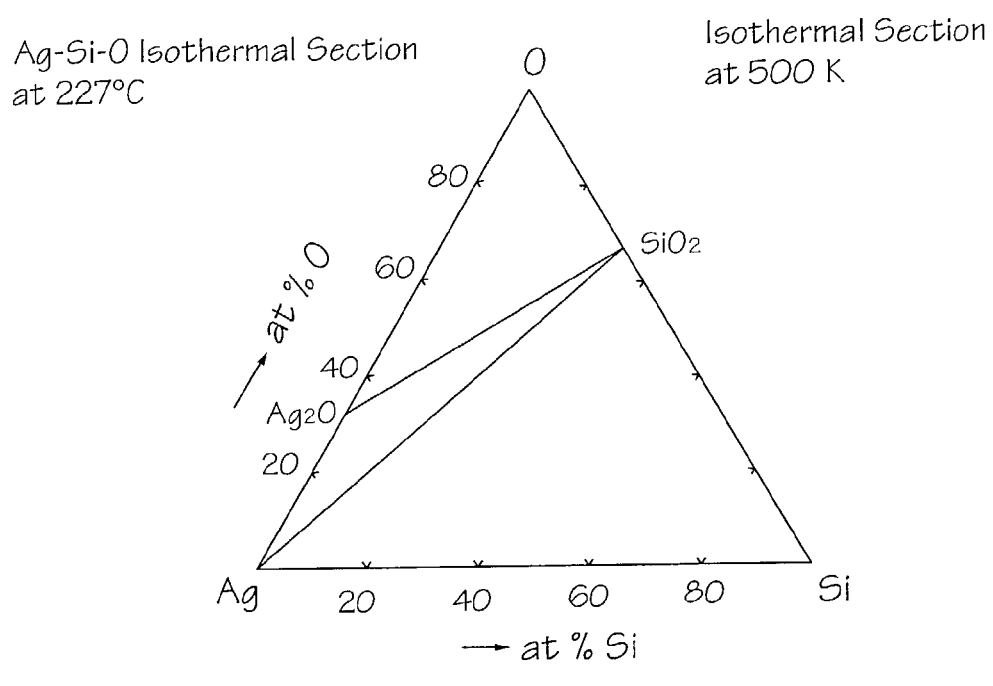

FIGS. 3A to 3G show ternary phase diagrams for transition metal—silicon—oxide material examples related to the present invention. As can be seen in FIGS. 3A and 3B (Mo—Si—O and W—Si—O), SiO2 is the dominant phase, whereas as can be seen in FIGS. 3C and 3D (Ta—Si—O and Ti—Si—O) neither oxide nor silicide phases are particularly dominant over other phases. FIG. 3E, on the other hand, shows that the metal oxide (ZrO2) in the ternary system Zr—Si—O, is the dominant phase, rather than SiO2. Fe—Si—O and Ag—Si—O ternary phase diagrams are shown in FIGS. 3F and 3G. Many other combinations of elements are possible in accordance with the invention, particularly if sputtering is the method of depositing the MEMS thin film. Late transition metals—particularly those in sections 8B and 1B of the periodic table (that is, those columns beginning with Fe, Co, Ni and Cu) can be used in the present invention, as these metals are often less prone to form oxides with respect to the proposed matrix element (or Si, Al, etc.) during the reactive sputtering process. Though early transition metals such as Ti, W, Ta, Re, V, Nb, Mo or Cr (or even group 3B elements such as La or Y) could be used (also HfSiO4 and ZrSiO4 could be deposited), late transition metals such as the noble metals (Ru, Rh, Pd, Ag, Os, Ir, Pt or Au) or other late transition metals such as the ferromagnetic transition metals (Co, Ni, or Fe) can be used in the present invention. Also, the matrix could be an oxide of the selected group 3A or 4A metal or metalloids, with late transition metals interspersed within the SiOx matrix (preferably noble metals)—though at lower oxygen concentrations, a metal silicide phase may exist as well. The noble metal silicon oxides can offer superior mechanical performance over their commonly used binary counterparts (e.g. silicon dioxide), with brittle SiO2 providing stiffness and high tensile yield strength and the noble metal affording ductility and toughness when combined.

The materials of the present invention can be etched by known methods. Ion milling or RF sputtering in an argon plasma can be used for patterning a variety of metal oxide materials. Dual frequency plasma technology can be useful in successfully etching materials such as metal oxides (and perovskites) by adjusting both ion energy at the wafer and ion flux. If the silicon and oxygen are part of the material, then standard SiO2 etching processes potentially could be used. A benefit of the materials of the present invention is that many are etch resistant. If a sacrificial layer of amorphous silicon is removed with an interhalogen or noble gas fluoride, many glass matrices (silicate, aluminosilicate, borosilicate, etc.) having TM particles or oxides mixed therewith in a deposited state, will be resistant to a sufficient degree so that the MEMS structure is minimally or negligibly etched. A silicon oxide matrix (with TM or TM—O) will resist gas phase etchants such as XeF2, BrCl3, BrF3, XeF4, ClF3, etc.

In one example of the invention a micromechanical device is provided where at least a portion of the device comprises an alloy of an oxide compound and a late transition metal. The oxide compound is an oxide of silicon, boron or aluminum preferably a silicon oxide or aluminum oxide. The late transition metal is selected from the groups 8B or 1B of the periodic table, and the late transition metal is a ferromagnetic metal. Also, the late transition metal could be a noble metal, or selected from Co, Ni, Pd, Pt, Ag or Au. The oxide can comprise less than 0.1 at % nitrogen, or the oxide could be an oxynitride that comprises up to 10 at % nitrogen. The substrate for such a MEMS device can be a semiconductor or light transmissive substrate, and both the movable element and/or the hinge are formed of the oxide compound and the late transition metal. Also, the MEMS device can include posts or walls for connecting the movable element to the substrate via the hinge, which can be formed of the oxide material of the invention. If the MEMS device is a micromirror, a light reflective layer can be provided proximate to the oxide material and can comprise any suitable reflective material such as Al, Ti or Au. The micromirror could be a light beam steering device such as within an optical switch or part of a micromirror array in a display (the display being e.g. a direct view or projection display). In another embodiment of the invention, a method of making a micromechanical device, comprises providing a sacrificial layer on a substrate; providing a structural element on the sacrificial layer; providing a flexible element for connecting the structural element directly or indirectly to the substrate, wherein the structural element and/or the flexible element of the MEMS device comprises an oxide compound and a late transition element; and removing the sacrificial layer so that the structural element is free to move via the flexible element relative to the substrate. The sacrificial layer can comprise any suitable material such as silicon or an organic material (e.g. a sacrificial amorphous silicon layer).

All or part of the MEMS device can be formed of the oxide of the invention (e.g. hinge or hinge/plate) and can be nearly or fully saturated with oxygen. A hinge, if present, can comprise particles of late transition metals or late transition metal suicides or borides interspersed within the oxide compound. The transition metal can make up from 10 to 80 atomic percent of the material formed and the elements of the oxide compound each range from 20 to 65 atomic percent. The ultimate tensile yield strength of the material of the MEMS device can be greater than 1 GPa.

When making the MEMS device, the relatively stiff portion (e.g. mirror element) can be formed before, at the same time, or after forming the flexible (e.g. hinge) portion, if both such portions are part of the MEMS device. The structural (relatively stiff) portion and/or the relatively flexible portion can be deposited by any suitable method, such as reactive sputtering in an oxygen atmosphere, as mentioned above. The sputtering atmosphere can have from 10 to 90% oxygen and structural and/or flexible elements have from 10 to 60 atomic % oxygen. The structural and/or flexible elements can be sputtered from a target comprised of from about 15 to 85% (or from 20 to 80%) late transition metal and from about 85 to 15% (or from 80 to 20%) silicon. The target can comprise at least one late transition metal and silicon, boron, or aluminum. Contrastly, the deposition can occur via co-sputtering of two separate targets, one supplying the transition metal and the other supplying the ceramic. Regardless of the actual target materials, the deposited layer(s) preferably will have a long range order of less than 100A. After depositing the layer(s) of the device, such layers can be annealed. Annealing of the MEMS device can be before or after removing the sacrificial layer.

Many variations from the above-described examples are possible. For example, in place of sputtering the films as described above, it is also possible to deposit some films by chemical vapor deposition (CVD) (e.g. plasma enhanced CVD or PECVD, or low pressure CVD or LPCVD). Also, though electrically conductive films are preferred in the present invention (e.g. for applying a potential to the movable element of the MEMS device, or simply for reducing charging in the device), electrically insulating films are also within the scope of the invention. Though the invention is directed to any MEMS device, specific mirrors and methods for projection displays or optical switching could be used with the present invention, such as those mirrors and methods set forth in U.S. Pat. No. 5,835,256 to Huibers issued Nov. 10, 1998; U.S. Pat. No. 6,046,840 to Huibers issued Apr. 4, 2000; U.S. patent applications Ser. No. 09/767,632 to True et al. filed Jan. 22, 2001; Ser. No. 09/564,069 to Richards filed May 3, 2000; Ser. No. 09/617,149 to Huibers et al. filed Jul. 17, 2000; Ser. No. 09/631,536 to Huibers et al. filed Aug. 3, 2000; Ser. No. 09/626,780 to Huibers filed Jul. 27, 2000; No. 60/293,092 to Patel et al. filed May 22, 2001; Ser. No. 09/637,479 to Huibers et al. filed Aug. 11, 2000; and No. 60/231,041 to Huibers filed Sep. 8, 2000. If the MEMS device is a mirror, the particular mirror shapes disclosed in U.S. patent application Ser. No. 09/732,445 to Ilkov et al. filed Dec. 7, 2000 could be used. Also, the MEMS device need not be a micromirror, but could instead be any MEMS device, including those disclosed in the above applications and in application No. 60/240,552 to Huibers filed Dec. 13, 2000. In addition, the sacrificial materials, and methods for removing them, could be those disclosed in U.S. patent application No. 60/298,529 to Reid et al. filed Jun. 15, 2001. Lastly, assembly and packaging of the MEMS device could be such as disclosed in U.S. patent application No. 60/276,222 filed Mar. 15, 2001. Each of these patents and applications is incorporated herein by reference.

Throughout the present application structures or layers are disclosed as being "on" (or deposited on), or over, above, adjacent, after, etc. other structures or layers. It should be recognized that this is meant to mean directly or indirectly on, over, above, adjacent, etc., as it will be recognized in the art that a variety of intermediate layers or structures could be interposed, including but not limited to sealant layers, adhesion promotion layers, electrically conductive layers, layers for reducing stiction, etc. In the same way, structures such as substrates or layers can be as a laminate due to additional structures or layers. Also, the recitation of "one or more" or "at least one" in one location should not in any way indicate that lack of use of such phraseology elsewhere indicates the absence of a potential plural arrangement. In addition, when the phrase "directly or indirectly" is used, it should in no way restrict, in places where this phrase is not used, the meaning elsewhere to either directly or indirectly. Also, "MEMS", "micromechanical" and "micro electromechanical" are used interchangeably herein and the structure may not have an electrical component. Lastly, unless the word "means" in a "means for" phrase is specifically set forth in the claims, it is not intended that any elements in the claims be interpreted in accordance with the specific rules relating to "means for" phraseology.

In addition, though the preferred matrix material is amorphous, a nanocrystalline or crystalline matrix material could be used. However when used as a flexible portion of a MEMS device, amorphous is preferred. The preferred MEMS device of the present invention is not a gas or other chemical sensor, and the ternary oxide material is preferably not pyroelectric, ferroelectric or piezoelectric (and preferably does not comprise elements from groups 1A or 2A (columns headed by H or Be) of the periodic table, except for H impurities, does not comprise organic material (preferably 2% or less) and is preferably not a perovskite, PZT, BST, SBT or PMN material). In fact, in a preferred embodiment, the oxide material (along with other portions of the MEMS device) are coated with a hydrophobic coating (e.g. a self assembled monolayer—from a silane precursor) so as to create a barrier to stop the material from absorbing or reacting with gases surrounding the device. Also, in a preferred embodiment, the MEMS device is actuated by electrostatic forces, and/or is preferably a MEMS switch, micromirror or accelerometer.

I claim:

1. A micromechanical device, comprising:
    a substrate;
    a movable element formed in or on the substrate with the movable element having a reflective layer thereon or therein;
    a hinge allowing movement of the movable element relative to the substrate, further comprising; a flexible hinge portion tha comprises an alloy of an oxide compound and a late transition metal, wherein the oxide compound is in the form of a matrix surrounding discrete late transition metal islands; and
    wherein the reflective layer comprises Al, Ti, or Au.

2. The micromechanical device of claim 1, wherein the oxide compound is an oxide of silicon, boron or aluminum.

3. The micromechanical device of claim 2, wherein the oxide compound is a silicon oxide or aluminum oxide.

4. The micromechanical device of claim 1, wherein the late transition metal is selected from the groups 8B or 1B of the periodic table.

5. The micromechanical device of claim 1, wherein the late transition metal is a ferromagnetic metal.

6. The micromechanical device of claim 1, which is a MEMS sensor or actuator.

7. The micromechanical device of claim 1, wherein the late transition metal is a noble metal.

8. The micromechanical device of claim 1, wherein the late transition metal is Co, Ni, Pd, Pt, Ag or Au.

9. The micromechanical device of claim 1, wherein the oxide comprises less than 0.1 at % nitrogen.

10. The micromechanical device of claim 1, wherein the oxide is an oxynitride that comprises up to 10 at % nitrogen.

11. The micromechanical device of claim 1, wherein at least a flexible hinge portion comprises the oxide compound and the late transition metal.

12. The micromechanical device of claim 1, wherein the substrate is a semiconductor or light transmissive substrate.

13. The micromechanical device of claim 1, wherein the movable element and/or the hinge are formed of the oxide compound and the late transition metal.

14. The micromechanical device of claim 13, further comprising posts or walls for connecting the movable element to the substrate via the hinge.

15. The micromechanical device of claim 1, wherein the hinge is a sputtered hinge.

16. The micromechanical device of claim 1, which is a sensor.

17. The micromechanical device of claim 1, wherein the micromirror device is a light beam steering device.

18. The micromechanical device of claim 17, wherein the light beam steering device is within an optical switch.

19. The micromechanical device of claim 1, wherein the micromirror device is part of a micromirror array in a display.

20. The micromechanical device of claim 19, wherein the display is a direct view or projection display.

21. A micromechanical device comprising:
a micromirror that further comprises a reflecting surface of a movable portion;
a flexible hinge portion that comprises a layer formed of one or more oxide compounds in a matrix surrounding a late transition metal; and
wherein the layer comprises an oxide or element selected from the late transition metals and an oxide of a group 3A or 4A element; and
wherein the flexible hinge portion further comprises a material that comprises an oxide of Al, Si or B and a late transition metal that does not form an oxide.

22. The micromechanical device of claim 21, wherein the layer is a substantially homogenous multiphase composite.

23. The micromechanical device of claim 21, wherein the layer is at least in an area of the device capable of flexing.

24. The micromechanical device of claim 21, wherein the layer is amorphous.

25. The micromechanical device of claim 21, wherein the layer has a long range order of less than 100 angstroms.

26. The micromechanical device of claim 21, wherein the oxide of the group 3A or 4A element is an oxide of selected elements from group 3A or 4A.

27. The micromechanical device of claim 26, wherein the oxide of group 3A or 4A element comprises an oxide of boron, aluminum or silicon.

28. The micromechanical device of claim 26, wherein the oxide of the group 3A or 4A element comprises an oxide of indium, tin, germanium and/or lead.

29. The micromechanical device of claim 21, wherein the oxide or element selected from the late transition metals is an oxide or element selected from Fe, Co or Ni.

30. The micromechanical device of claim 29, wherein the late transition metal is Co.

31. The micromechanical device of claim 30, wherein the oxide from group 3A or 4A is an oxide of silicon or aluminum.

32. The micromechanical device of claim 21, wherein the oxide or element selected from the late transition metals is an oxide or element selected from Ru, Rh, Pd, Pt, Ir, Os, Ag or Au.

33. The micromechanical device of claim 21, wherein the oxide or element selected from the late transition metals is a conductive oxide.

34. The micromechanical device of claim 21, wherein the late transition metal is Ru, Rh, Ir or Os.

35. The micromechanical device of claim 34, wherein the late transition metal is Ru or Ir.

36. The micromechanical device of claim 21, wherein the flexible hinge portion further comprises a material that comprises a late transition metal that forms an oxide.

37. The micromechanical device of claim 21, wherein the flexible hinge portion further comprises a material that comprises a late transition metal that does not form an oxide.

38. The micromechanical device of claim 21, wherein the flexible hinge portion further comprises a material that comprises an oxide of In, Sn, Ti and/or Pb, and an oxide of Ru, Rh, Os or Ir.

39. The micromechanical device of claim 38, wherein the flexible hinge portion further comprises a material that has a long range order of less than 100 angstrom.

40. The micromechanical device of claim 21, wherein the late transition metal is Pd, Pt, or Au.

41. The micromechanical device of claim 21, wherein the layer comprises a sputtered material.

42. A micromechanical device, comprising:
a flexible hinge portion that comprises an alloy of an oxide compound and a late transition metal, wherein the oxide compound is in the form of a matrix surrounding discrete late transition metal islands; and
wherein the late transition metal is a ferromagnetic metal.

43. A micromechanical device, comprising:
a flexible hinge portion that comprises an alloy of an oxide compound and a late transition metal, wherein the oxide compound is in the form of a matrix surrounding discrete late transition metal islands;
wherein the late transition metal is Co, Ni, Pd, Pt, Ag or Au.

44. A micromechanical device comprising:
a micromirror that further comprises a reflecting surface of a movable portion;
a flexible hinge portion that comprises a layer formed of one or more oxide compounds in a matrix surrounding a late transition metal;
wherein the layer comprises an oxide or element selected from the late transition metals and an oxide of a group 3A or 4A element;
wherein the flexible hinge portion further comprises a material that comprises an oxide of In, Sn, Ti and/or Pb, and an oxide of Ru, Rh, Os or Ir;
wherein the oxide of the group 3A or 4A element comprises an oxide of indium, tin, germanium and/or lead; and
wherein the oxide of the group 3A or 4A element is an oxide of selected elements from group 3A or 4A.

45. A micromechanical device comprising:
a micromirror that further comprises a reflecting surface of a movable portion;
a flexible hinge portion that comprises a layer formed of one or more oxide compounds in a matrix surrounding a late transition metal;
wherein the layer comprises an oxide or element selected from the late transition metals and an oxide of a group 3A or 4A element;

wherein the flexible hinge portion further comprises a material that comprises an oxide of In, Sn, Ti and/or Pb, and an oxide of Ru, Rh, Os or Ir; and wherein the oxide or element selected from the late transition metal is an oxide or element selected from Fe, Co or Ni.

46. A micromechanical device comprising:

a micromirror that further comprises a reflecting surface of a movable portion;

a flexible hinge portion that comprises a layer formed of one or more oxide compounds in a matrix surrounding a late transition metal;

wherein the layer comprises an oxide or element selected from the late transition metals and an oxide of a group 3A or 4A element; and wherein the flexible hinge portion further comprises a material that comprises an oxide of In, Sn, Ti and/or Pb, and an oxide of Ru, Rh, Os or Ir; and wherein the flexible hinge portion further comprises a material that comprises a late transition metal that does not form an oxide.

* * * * *

UNITED STATES PATENT AND TRADEMARK OFFICE
CERTIFICATE OF CORRECTION

| | | |
|---|---|---|
| PATENT NO. | : 7,057,251 B2 | Page 1 of 1 |
| APPLICATION NO. | : 10/198389 | |
| DATED | : June 6, 2006 | |
| INVENTOR(S) | : Jason Reid | |

It is certified that error appears in the above-identified patent and that said Letters Patent is hereby corrected as shown below:

Column 14, line 40, "rnicrornechanical" should read- micromechanical

Signed and Sealed this

Eighth Day of August, 2006

JON W. DUDAS
*Director of the United States Patent and Trademark Office*